(12) United States Patent
Robin et al.

(10) Patent No.: US 9,967,937 B2
(45) Date of Patent: May 8, 2018

(54) LIGHT-EMITTING DEVICE (71) Applicant: Commissariat a l'energie atomique et aux energies alternatives, Paris (FR)

(72) Inventors: Ivan-Christophe Robin, Grenoble (FR); Hubert Bono, Grenoble (FR)

(73) Assignee: Commissariat à l'énergie atomique et aux énergies alternatives, Paris (FR)

(*) Notice: Subject to any disclaimer, the term of this patent is extended or adjusted under 35 U.S.C. 154(b) by 0 days. days.

(21) Appl. No.: 15/031,963

(22) PCT Filed: Oct. 24, 2014

(86) PCT No.: PCT/EP2014/072900
§ 371 (c)(1),
(2) Date: Apr. 25, 2016

(87) PCT Pub. No.: WO2015/059296
PCT Pub. Date: Apr. 30, 2015

(65) Prior Publication Data
US 2016/0270176 A1    Sep. 15, 2016

(30) Foreign Application Priority Data

Oct. 25, 2013    (FR) ..................................... 13 60420

(51) Int. Cl.
*H01L 33/00*    (2010.01)
*H05B 33/08*    (2006.01)
(Continued)

(52) U.S. Cl.
CPC ... *H05B 33/0848* (2013.01); *H01L 31/03048* (2013.01); *H01L 31/1848* (2013.01);
(Continued)

(58) Field of Classification Search
CPC ............ H05B 33/0803; H05B 33/0818; H05B 33/086; H05B 33/0863; H05B 33/0869;
(Continued)

(56) References Cited

U.S. PATENT DOCUMENTS 9,029,867 B2 *    5/2015    Walukiewicz ........ H01L 29/778
                                                                                    257/103
9,401,454 B2    7/2016    Robin et al.
(Continued)

FOREIGN PATENT DOCUMENTS

CN    102122689 A *    7/2011
JP    11-87773 A    3/1999
(Continued)

OTHER PUBLICATIONS

U.S. Appl. No. 14/748,707, filed Jun. 24, 2015, US 2015-0380459 A1, Hubert Bono et al.

(Continued)

*Primary Examiner* — Kretelia Graham
*Assistant Examiner* — Borna Alaeddini
(74) *Attorney, Agent, or Firm* — Oblon, McClelland, Maier & Neustadt, L.L.P.

(57) ABSTRACT

A light-emitting device including a light-emitting diode including an n-doped InGaN layer and a p-doped GaN layer, and an active zone including a number m of InGaN-emitting layers each one arranged between two InGaN barrier layers, of which the indium compositions of the emitting layers are different and are greater on the side of the n-doped InGaN layer than on the side of the p-doped GaN layer, and of which the indium compositions of the barrier layers are different and which are greater on the side of the n-doped InGaN layer than on the side of the p-doped GaN layer. An electric power supply supplies the diode with a periodic signal. A controller of the power supply can alter the peak (Continued)

value of the periodic signal according to a spectrum of the light emitted.

16 Claims, 7 Drawing Sheets

(51) Int. Cl.

| | |
|---|---|
| H01L 31/18 | (2006.01) |
| H01L 31/0304 | (2006.01) |
| H01L 33/06 | (2010.01) |
| H01L 33/32 | (2010.01) |
| H05B 37/02 | (2006.01) |
| H01L 25/16 | (2006.01) |
| H01L 33/18 | (2010.01) |
| H01L 33/24 | (2010.01) |

(52) U.S. Cl.
CPC .......... *H01L 33/0075* (2013.01); *H01L 33/06* (2013.01); *H01L 33/32* (2013.01); *H05B 33/0815* (2013.01); *H05B 33/0866* (2013.01); *H05B 37/0227* (2013.01); *H01L 25/167* (2013.01); *H01L 33/18* (2013.01); *H01L 33/24* (2013.01); *H01L 2924/0002* (2013.01); *H01L 2924/10346* (2013.01)

(58) Field of Classification Search
CPC ............. H01L 33/0075; H01L 31/1848; H01L 31/03048; H01L 2924/10346
USPC .............................. 345/204, 609, 691, 82, 83
See application file for complete search history.

(56) References Cited

U.S. PATENT DOCUMENTS

| | | | |
|---|---|---|---|
| 9,515,220 | B2 | 12/2016 | Robin |
| 2005/0168564 | A1* | 8/2005 | Kawaguchi ........ H05B 33/0803 347/237 |
| 2006/0160257 | A1 | 7/2006 | Wu et al. |
| 2009/0040755 | A1 | 2/2009 | Kopp et al. |
| 2009/0078955 | A1 | 3/2009 | Fan et al. |
| 2010/0187497 | A1 | 7/2010 | Nago et al. |
| 2012/0223289 | A1 | 9/2012 | Gwo et al. |
| 2013/0026484 | A1 | 1/2013 | Walukiewicz et al. |
| 2014/0008607 | A1* | 1/2014 | Wang ................ H01L 31/03523 257/13 |

FOREIGN PATENT DOCUMENTS

| | | |
|---|---|---|
| JP | 2008-34887 A | 2/2008 |
| WO | WO 2013/009552 A2 | 1/2013 |

OTHER PUBLICATIONS

U.S. Appl. No. 14/750,156, filed Jun. 25, 2015, US 2015-0380461 A1, Ivan-Christophe Robin et al.
U.S. Appl. No. 14/779,516, filed Sep. 23, 2015, US 2016-0049544 A1, Ivan-Christophe Robin et al.
U.S. Appl. No. 14/913,254, filed Feb. 19, 2016, US 2016-0204307 A1, Ivan-Christophe Robin et al.
U.S. Appl. No. 15/031,992, filed Apr. 25, 2016, US 2016-0276328 A1, Ivan-Christophe Robin et al.
U.S. Appl. No. 15/031,881, filed Apr. 25, 2016, US 2016-0270187 A1, Ivan-Christophe Robin et al.
U.S. Appl. No. 15/031,963, filed Apr. 25, 2016, US 2016-0270176 A1, Ivan-Christophe Robin et al.
International Search Report dated Dec. 22, 2014 in PCT/EP2014/072900.
French Preliminary Search Report dated May 15, 2014 in Patent Application No. 1360420 (with English Translation of Category of Cited Documents).
Shuji Nakamura et al., "Candela-class High-Brightness InGaN/AlGaN Double-heterostructure Blue-light-emitting Diodes", Appl. Phys. Lett., 64, Mar. 28, 1994, pp. 1687-1689 and Cover page.
T. Tanaka et al., "p-type Conduction in Mg-doped GaN and $Al_{0.08}Ga_{0.92}N$ Grown by Metalorganic Vapor Phase Epitaxy", Appl. Phys. Lett., 65, Aug. 1, 1994, pp. 593-594 and Cover page.
W. Götz et al., "Activation of Acceptors in Mg-doped GaN Grown by Metalorganic Chemical Vapor Deposition", Appl. Phys. Lett., 68, Jan. 29, 1996, pp. 667-669 and Cover page.
J. D. Thomson et al., "The Influence of Acceptor Anneal Temperature on the Performance of InGaN/GaN Quantum Well Light-emitting Diodes", Journal of Appl. Phys. 99, (2006), pp. 024507-1-024507-7 and Cover page.
Shuji Nakarnura et al., "High-power InGaN Single-quantum-well-structure Blue and Violet Light-emitting Diodes", Appl. Phys. Lett. 67, Sep. 25, 1995, pp. 1868-1870 and Cover page.
Aurélien David et al., "Carrier Distribution in (0001)InGaN/GaN Multiple Quantum Well Light-emitting Diodes", Appl. Phys. Lett. 92, (2008), pp. 053502-1-053502-3.
Sang-Heon Han et al., "Effect of Electron Blocking Layer on Efficiency Droop in InGaN/GaN Multiple Quantum Well light-emitting Diodes", Appl. Phys. Lett. 94, (2009), pp. 231123-1-231123-3 and Cover page.
F. Akyol et al., "Suppression of Electron Overflow and Efficiency Droop in N-polar GaN Green Light Emitting Diodes", Appl. Phys. Lett. 100,(2012), pp. 111118-1-111118-4 and Cover page.
X. Ni et al., "InGaN Staircase Electron Injector for Reduction of Electron Overflow in InGaN light Emitting Diodes", Applied Physics Letters 97, (2010), pp. 031110-1-031110-3 and Cover page.
Jinqiao Xie et al., "On the Efficiency Droop in InGaN Multiple Quantum Well Blue Light Emitting Diodes and its Reduction with p-doped Quantum Well Barriers", Applied Physics Letters 93, (2008), pp. 121107-1-121107-3 and Cover page.
Yen-Kuang Kuo et al., "Advantages of Blue InGaN Multiple-Quantum Well Light-emitting Diodes with InGaN Barriers", Applied Physics Letters 95, (2009), pp. 011116-1-011116-3 and Cover page.

* cited by examiner

LIGHT-EMITTING DEVICE

TECHNICAL FIELD ET PRIOR ART

The invention relates to the field of light-emitting diodes (named LEDs), as well as that of light-emitting devices comprising such LEDs (screens, projectors, display walls, etc.).

The invention applies in particular to the making of LEDs with multiple quantum wells (MQW) that carry out emissions of light that are homogeneous in terms of intensity and in ranges of wavelengths that are different with respect to one another. The invention advantageously applies to the making of LEDs that emit a white light, i.e. a substantially homogeneous mixture of wavelengths corresponding to the colours red, green and blue.

Materials comprising GaN, such as GaN, InGaN, or AlGaN, are used to make LEDs that emit in ranges of wavelengths that correspond to UV (Ultra-Violet), blue, green, and even red when these LEDs are made with a geometry of nanowires. Indeed, the energy of the band gap of the GaN, which is equal to 3.42 eV at ambient temperature, makes it possible to obtain an emission in UV. By adding indium to the GaN in order to form InGaN, the energy of the band gap of the material is lowered, which makes it possible to offset the emission wavelengths in the visible range. A LED emitting a blue light is for example obtained by making quantum wells of InGaN wherein the indium composition is between 5% and 20%, this indium composition in the emitting layers of the quantum wells being greater than that of the material of the barrier layers arranged between the quantum wells.

The technique currently used to manufacture LEDs comprising semiconductor such as GaN consists in making a p-n junction, i.e. place in contact electrically a p-doped semiconductor with a n-doped semiconductor, with, between these p-doped and n-doped semiconductors, an intrinsic region, i.e. unintentionally doped, comprising in particular quantum wells. A depletion zone is then obtained at the junction, and in particular at quantum wells. By passing an electric current in this structure, radiative recombinations of charges (electrons and holes) are then obtained at the depletion zone, resulting in a light emission from the quantum wells. The quantum wells correspond for example to layers of InGaN with a thickness between 0.5 nm and 10 nm and comprising indium compositions between 5% and 30%. This makes it possible to locate the charges in these quantum wells in order to increase the effectiveness of the radiative emission and prevent the charges from being lost on non-radiative defects.

Document US 2009/0078955 A1 describes a light-emitting device comprising, for each pixel, three superposed LEDs each emitting in one of the ranges of wavelengths that corresponds to the colours red, green and blue. Such a light-emitting device therefore makes it possible to carry out an emission of white light by emitting, from each one of the LEDs of a pixel, of red, green and blue lights of similar intensities. However, the making of such a device is complex and expensive as the stack of three p-n functions in each pixel entails making electrical connections for each one of these junctions in order to control the light emission of each one of the LEDs. Such a device also poses problems of encumbrance due in particular to the electrical connections required.

Document US 2012/0223289 A1 describes a light-emitting device comprising, in each pixel, sub-pixels formed by one or several LEDs intended to emit red, green and blue lights in order to globally obtain, at the level of the pixel, an emission of white light. The LEDs are here made in the form of nanowires arranged next to one another. The same problems of cost, complexity and encumbrance as those mentioned hereinabove also exist for this type of device.

Document WO 2013/009552 A2 described a LED comprising InGaN p-n junctions. Although such a LED can emit a light of different colours, the adjusting of the wavelength emitted by such a LED is not easy and this emitted wavelength tends to remain centred on the colour green.

DISCLOSURE OF THE INVENTION

A purpose of this invention is to propose a light-emitting device comprising a light-emitting diode, or LED, with multiple quantum wells wherein the light emissions of the quantum wells are substantially homogeneous, in terms of light intensity, with respect to one another, and making it possible to easily adjust the colour emitted by the LED among all of those in the visible spectrum or white.

For this, this invention proposes a light-emitting device comprising at least:
- a light-emitting diode comprising at least one n-doped $In_{Xn}Ga_{(1-Xn)}N$ layer and a p-doped GaN layer forming together a p-n junction, and an active zone arranged between the n-doped $In_{Xn}Ga_{(1-Xn)}N$ layer and the p-doped GaN layer and comprising a number m of $In_{Yi}Ga_{(1-Yi)}N$ emitting layers each one arranged between two $In_{Zj}Ga_{(1-Zj)}N$ barrier layers that are in contact with said emitting layer on two opposite faces of said emitting layer, wherein:
  - for i between 1 and m−1, the indium compositions of the emitting layers are such that $Y(i+1)<Yi$, the $(i+1)^{th}$ emitting layer being arranged between the $(i)^{th}$ emitting layer and the p-doped GaN layer;
  - for j between 1 and m, the indium compositions of the barrier layers are such that $Z(j+1)<Zj$, the $(j+1)^{th}$ barrier layer being arranged between the $(j)^{th}$ barrier layer and the p-doped GaN layer;
  - for i=j, the indium compositions of the emitting layers and of the barrier layers are such that $Zj<Yi$ and $Z(j+1)<Yi$;
  with m: integer greater than or equal to 2;
  i: integer between 1 and m;
  j: integer between 1 and (m+1);
- an electric power supply able to electrically power the light-emitting diode with a periodic signal,
- a device for controlling the power supply which can alter the peak value of the periodic signal according to at least one spectrum of the light intended to be emitted by the light-emitting diode.

It also describes a light-emitting diode comprising at least one n-doped $In_{Xn}Ga_{(1-Xn)}N$ layer and a p-doped GaN layer forming together a p-n junction, and an active zone arranged between the n-doped $In_{Xn}Ga_{(1-Xn)}N$ layer and the p-doped GaN layer and comprising a number m of $In_{Yi}Ga_{(1-Yi)}N$ emitting layers each one arranged between two $In_{Zj}Ga_{(1-Zj)}N$ barrier layers that are in contact with said emitting layer on two opposite faces of said emitting layer, wherein:
- for i between 1 and m−1, the indium compositions of the emitting layers are such that $Y(i+1)<Yi$, the $(i+1)^{th}$ emitting layer being arranged between the $(i)^{th}$ emitting layer and the p-doped GaN layer;
- for j between 1 and m, the indium compositions of the barrier layers are such that $Z(j+1)<Zj$, the $(j+1)^{th}$ barrier layer being arranged between the $(j)^{th}$ barrier layer and the p-doped GaN layer;

for i=j, the indium compositions of the emitting layers and of the barrier layers are such that $Zj<Yi$ and $Z(j+1)<Yi$;

with m: integer greater than or equal to 2;

i: integer between 1 and m;

j: integer between 1 and (m+1).

The light-emitting diode therefore comprises a number m of emitting layers, forming a number m of quantum wells, of which the indium compositions are different with respect to one another and are greater on the side of the n-doped $In_{Xn}Ga_{(1-Xn)}N$ layer than on the side of the p-doped GaN layer. These quantum wells therefore carry out light emissions in ranges of different wavelengths and able to cover in particular the entire visible spectrum. In addition, in light of the barrier layers between which the emitting layers are arranged and which comprise also indium compositions that are different with respect to one another and which are greater on the side of the n-doped $In_{Xn}Ga_{(1-Xn)}N$ layer than on the side of the p-doped GaN layer, the light emissions carried out by the quantum wells are substantially homogeneous with respect to one another in terms of light intensity.

The global light spectrum emitted by the light-emitting diode can therefore easily be adjusted via the choice of the indium compositions of the emitting layers, with the indium compositions of the barrier layers being chosen according to the indium compositions of the emitting layers.

In addition, with such barrier layers, a threshold voltage intended to be applied to the terminals of the light-emitting diode for a given current density passing through the light-emitting diode is less than that required to obtain the same current density in a light-emitting diode that would comprise GaN barrier layers.

In addition, with such a light-emitting diode, the global light spectrum emitted by the light-emitting diode can easily be adjusted by wisely choosing the parameters of a periodic signal that electrically powers the light-emitting diode such as the peak value and the duty cycle of this periodic signal. Adjusting the parameters of the power signal makes it possible to vary the current density in the light-emitting diode, which modifies the rate of emission from one well to the other within the diode, therefore making it possible to control the spectrum of the emitted light, i.e. the colour of the emitted light.

The barrier layers may each have a thickness between about 1 nm and 25 nm, and/or the first $In_{Z1}Ga_{(1-Z1)}N$ barrier layer may have a thickness greater than or equal to 2 nm.

The indium compositions Yi and/or Zj may be such that:

$Z(m+1)=0$, and/or pour $i=j$: $0.15\ Yi<Zj<0.9\ Yi$, and/or for j between 1 and m: $0.25\ Zj<Z(j+1)<0.9\ Zj$.

The number m of emitting layers may be equal to 3, with the first emitting layer able to carry out a light emission in the range of the wavelengths of the colour red, with the second emitting layer able to carry out a light emission in the range of the wavelengths of the colour green, and with the third emitting layer able to carry out a light emission in the range of the wavelengths of the colour blue. As such, in light of the homogeneity of the light emissions carried out by the emitting layers, the light-emitting diode carries out a light emission of white colour.

The number m of emitting layers may be equal to 3, and Y1 may be equal to about 0.4, and/or Y2 may be equal to about 0.25, and/or Y3 may be equal to about 0.15, and/or Z1 may be equal to about 0.12, and/or Z2 may be equal to about 0.09, and/or Z3 may be equal to about 0.07, and/or Z4 may be equal to about 0.05.

With such indium compositions, the light-emitting diode carries out a light emission of white colour.

The indium composition Xn may be between 0 and about 0.3, and/or the indium composition Xn may vary between a first value $Xn_a$ and a second value $Xn_b$ greater than the first value $Xn_a$ according to a direction substantially perpendicular to a first face of the n-doped $In_{Xn}Ga_{(1-Xn)}N$ layer opposite which the first emitting layer is arranged, and the indium composition at the first face of the n-doped $In_{Xn}Ga_{(1-Xn)}N$ layer may be equal to $Xn_b$ and the indium composition at a second face of the n-doped $In_{Xn}Ga_{(1-Xn)}N$ layer, opposite the first face, may be equal to $Xn_a$.

In this case, $Xn_a$ may be equal to 0, and $Xn_b$ may be greater than 0 and less than or equal to about 0.3.

The indium composition Zj in each one of the barrier layers may vary between a first value $Zj_a$ and a second value $Zj_b$ greater than the first value $Zj_a$ according to a direction substantially perpendicular to a face of said barrier layer against which one of the emitting layers is arranged, the indium composition at a first face of said barrier layer being located on the side of the n-doped $In_{Xn}Ga_{(1-Xn)}N$ layer able to be equal to $Zj_b$, the indium composition at a second face of said barrier layer, opposite said first face and being located on the side of the p-doped GaN layer able to be equal to $Zj_a$.

In this case, the indium compositions Zj in each one of the barrier layers may advantageously be such that $Zj_a>Z(j+1)_b$ and/or, for each one of the barrier layers, the difference between the first value $Zj_a$ and the second value $Zj_b$ may be less than or equal to about 0.3.

The light-emitting diode is advantageously used to make light display devices such as micro-displays or micro-projectors, due to the fact that such a light-emitting diode offers the possibility to make display devices with pixels that can be adjusted in wavelength thanks to the choice of the parameters of the periodic signal electrically powering the light-emitting diode.

The periodic signal may comprise a duty cycle α, and the device for controlling the electric power supply may be able to modify the duty cycle α of the periodic signal according to a value of the intensity of the light intended to be emitted by the light-emitting diode.

The duty cycle α may be such that $α∈]0;1]$.

The electric power supply may be a switched-mode electric power supply.

The light-emitting device may further comprise a device for detecting a spectrum and/or an intensity of a light intended to be emitted by the light-emitting diode, and the device for controlling the electric power supply may be able to modify the peak value and/or the duty cycle α of the periodic signal respectively according to the values of the spectrum and of the intensity of the light intended to be detected and according to the target values of the spectrum and of the intensity.

The invention also concerns a method for making a light-emitting device according to the invention, wherein the layers of the light-emitting diode are planar layers made by growth on top of one another, or wherein the layers of the light-emitting diode are made by growth in the form of radial or axial nanowires.

BRIEF DESCRIPTION OF THE DRAWINGS

This invention shall be better understood when reading the description of embodiments provided solely for the purposes of information and in no way limiting in reference to the annexed drawings wherein.

Identical, similar or equivalent parts of the various figures described hereinafter bear the same numerical references in such a way as to facilitate passing from one figure to another.

The various parts shown in the figures are not necessarily shown according to a uniform scale, in order to make the figures more legible.

The various possibilities (alternatives and embodiments) must be understood as not being exclusive with respect to one another and can be combined together.

DETAILED DISCLOSURE OF PARTICULAR EMBODIMENTS

Figure 1:
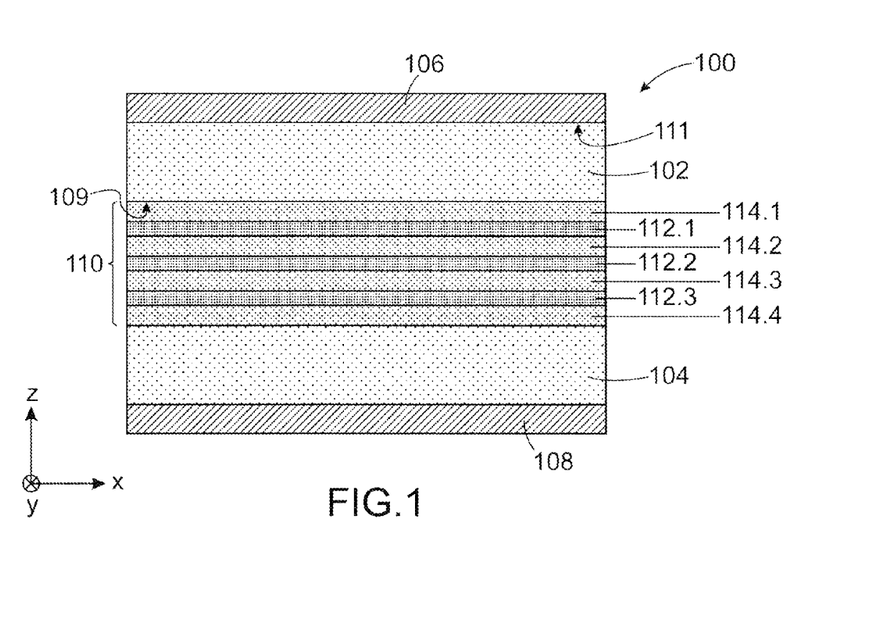
FIG. 1 diagrammatically shows a light-emitting diode of a light-emitting device, subject-matter of this invention, according to a particular embodiment.

Reference is first made to FIG. 1 which shows a light-emitting diode, or LED, 100 according to a particular embodiment.

The LED 100 comprises a p-n junction formed by an n-doped $In_{Xn}Ga_{(1-Xn)}N$ layer 102 and a p-doped GaN layer (GaN-p) 104. The layer 102 comprises n-doped GaN (GaN-n) or n-doped InGaN (InGaN-n) according to the value of the indium composition Xn which is for example between 0.05 and 0.35. The layer 102 is n-doped with a concentration of donors between about $10^{17}$ and $5 \cdot 10^{19}$ donors/cm$^3$. The layer 104 comprises GaN-p with a concentration of acceptors between about $10^{17}$ and $5 \cdot 10^{19}$ donors/cm$^3$. These two layers 102 and 104 each have for example a thickness (dimension according to the Z-axis shown in FIG. 1) between about 20 nm and 10 μm. A first metal electrode 106 is arranged against the n-doped layer 102 and forms a cathode of the LED 100, and a second metal electrode 108 is arranged against the p-doped layer 104 and forms an anode of the LED 100.

The LED 100 comprises, between the layers 102 and 104, an active zone 110 comprising a number m of InGaN emitting layers 112, with m being an integer greater than or equal to 2. The active zone 110 is arranged against a first face 109 of the n-doped layer 102, opposite a second face 111 of the n-doped layer 102 against which the first metal electrode 106 is arranged. The LED 100 described here comprises three emitting layers 112, referenced as 112.1, 112.2 and 112.3, each one forming a quantum well. The thickness of each one of the emitting layers 112 is for example between about 0.5 and 10 nm. The active zone 110 comprises also m+1 barrier layers 114 of InGaN such that each emitting layer 112 is arranged between two barrier layers 114, and therefore that the active zone 110 is formed of an alternating stack of a number m of emitting layers 112 and of m+1 barrier layers 114.

The LED 100 described here comprises four barrier layers 114, referenced as 114.1, 114.2, 114.3 and 114.4, such that the first emitting layer 112.1 is arranged between the first barrier layer 114.1 and the second barrier layer 114.2, that the second emitting layer 112.2 is arranged between the second barrier layer 114.2 and the third barrier layer 114.3, and that the third emitting layer 112.3 is arranged between the third barrier layer 114.3 and the fourth barrier layer 114.4. The first barrier layer 114.1 is arranged against the n-doped layer 102 and the last barrier layer 114.4 (or 114.(m+1) for the general case of a number m of emitting layers) is arranged against the p-doped layer 104. Alternatively, a buffer layer of InGaN with a thickness greater than that of the first barrier layer 114.1 could be interposed between the first barrier layer 114.1 and the n-doped layer 102.

In this case, the indium composition of this buffer layer is greater than or equal to that of the material of the first barrier layer 114.1. In addition, the n-doped layer 102 can in this case not comprise indium and comprises for example GaN. The thickness of each one of the barrier layers 114 is for example between about 1 nm and 25 nm. In addition, the thickness of the first barrier layer 114.1 arranged against the n-doped layer 102 is preferably greater than or equal to about 2 nm.

All of the layers of the active zone 110 of the LED 100, i.e. the emitting layers 112 and the barrier layers 114, comprise unintentionally doped materials (of a concentration in residual donors $n_{nid}$ equal to about $10^{17}$ donors/cm$^3$, or between about $10^{15}$ and $10^{18}$ donors/cm$^3$).

Each one of the emitting layers 112 of the LED 100 is here intended to carry out a light emission in a range of wavelengths different from those emitted by the other emitting layers 112 of the LED 100. For this, the indium composition of the material of each emitting layer 112 is different from that of the materials of the other emitting layers 112. Considering that the (i)$^{th}$ emitting layer 112.i comprises $In_{Yi}Ga_{(1-Yi)}N$, for i between 1 and m−1, the indium compositions Yi in the emitting layers 112 are such that Y(i+1)<Yi, the (i+1)$^{th}$ emitting layer 112.(i+1) being arranged between the (i)$^{th}$ emitting layer 112.i and the p-doped layer 104.

As such, the emitting layer 112 comprising the largest indium composition is the first emitting layer 112.1 which is located on the side of the n-doped layer 102, and the one comprising the smallest indium composition is the last emitting layer 112.m which is located on the side of the p-doped layer 104, i.e. the third emitting layer 112.3 in the example of FIG. 1. The indium compositions in the different emitting layers 112 decrease with respect to one another in the direction from the n-doped layer 102 to the p-doped layer 104.

The values of the indium compositions in the different emitting layers 112 are adapted according to the function of the desired colorimetry, i.e. of the emitted emissions spectrum desired for each one of the quantum wells of the LED 100. In the example of FIG. 1, the first emitting layer 112.1 is intended to carry out a light emission in the range of the wavelengths of the colour red, for example at a wavelength equal to about 600 nm, the second emitting layer 112.2 is intended to carry out a light emission in the range of the wavelengths of the colour green, for example at a wavelength equal to about 500 nm, and the third emitting layer 112.3 is intended to carry out a light emission in the range of the wavelengths of the colour blue, for example at a wavelength equal to about 430 nm. In order to carry out these light emissions, the indium composition Y1 of the $In_{Y1}Ga_{(1-Y1)}N$ of the first emitting layer 112.1 is equal to about 40%, the indium composition Y2 of the $In_{Y2}Ga_{(1-Y2)}N$ of the second emitting layer 112.2 is equal to about 25%, and the indium composition Y3 of the $In_{Y3}Ga_{(1-Y3)}N$ of the third emitting layer 112.3 is equal to about 15%.

In the LED 100, the light emissions carried out by the different quantum wells of the active zone 110 are homogeneous in terms of light intensity. As such, so that the LED 100 of FIG. 1 carries out a light emission of white colour, the three quantum wells of the LED 100 are made such that the intensities of their light emissions are homogeneous with respect to one another. This homogeneity of the light emissions of the different quantum wells of the LED 100 is obtained by choosing wisely the indium compositions of the materials of the barrier layers 114. Considering that the $(j)^{th}$ barrier layer 114.j comprises $In_{Zj}Ga_{(1-Z)}N$, for j between 1 and m, the indium compositions in the barrier layers 114 are such that $Z(j+1)<Zj$, the $(j+1)^{th}$ barrier layer 114.(j+1) being arranged between the $(j)^{th}$ barrier layer 114.j and the p-doped layer 104. As such, the barrier layer 114 comprising the largest indium composition is the first barrier layer 114.1 which is located on the side of the n-doped layer 102, and the one comprising the smallest indium composition (this indium composition can be zero) is the last barrier layer 114.(m+1) being located on the side of the p-doped layer 104, i.e. the fourth barrier layer 114.4 in the example of FIG. 1. The indium compositions in the various barrier layers 114 decrease with respect to one another in the direction from the n-doped layer 102 to the p-doped layer 104.

In the example described hereinabove, the p-doped layer 104 comprises GaN. Alternatively, the p-doped layer 104 may comprise InGaN. In this case, the indium composition of the InGaN of the p-doped layer 104 is less than or equal to that of the material of the last barrier layer 114.(m+1).

The values of the indium compositions of the InGaN of the barrier layers 114 are adapted in particular according to the values of the indium compositions of the InGaN of the emitting layers 112. As such, for i=j, the indium composition in the $(i)^{th}$ emitting layer 112.i, the indium composition in the $(j)^{th}$ barrier layer 114.j and the indium composition in the $(j+1)^{th}$ barrier layer 114.(j+1) are such that $Zj<Yi$ and $Z(j+1)<Yi$, and advantageously such that $0.15\,Yi<Zj<0.9\,Yi$, and more preferably such that $0.25\,Yi<Zj<0.5\,Yi$. In addition, the values of the indium compositions of the InGaN of the barrier layers 114 may be chosen as a function of one another. As such, for j between 1 and m, the indium compositions in the barrier layers 114 are for example such that $0.25\,Zj<Z(j+1)<0.9\,Zj$, and more preferably such that $0.5\,Zj<Z(j+1)<0.9\,Zj$, or such that $0.7\,Zj<Z(j+1)<0.8\,Zj$ and for example such that $Z(j+1)$ is equal to about $0.75\,Zj$. Furthermore, the indium composition of the first barrier layer 114.1 may be similar to that of the n-doped layer 102.

In the example described here, in light of the light emissions desired for the various quantum wells of the LED 100, the indium composition Z1 of the $In_{Z1}Ga_{(1-Z1)}N$ of the first barrier layer 114.1 is equal to about 12% (and equal to that of the n-doped layer 102), the indium composition Z2 of the $In_{Z2}Ga_{(1-Z2)}N$ of the second barrier layer 114.2 is equal to about 9%, the indium composition Z3 of the $In_{Z3}Ga_{(1-Z3)}N$ of the third barrier layer 114.3 is equal to about 7%, and the indium composition Z4 of the $In_{Z4}Ga_{(1-Z4)}N$ of the fourth barrier layer 114.4 is equal to about 5%.

The value of the voltage applied to the terminals of the metal electrodes 106 and 108 of the LED 100 is according to the current density sought in the LED. This current density is more preferably between about 60 and 90 A/cm$^2$ in order to retain a very good emissions homogeneity between the different quantum wells of the LED 100.

In order to show the homogeneity of the light emissions of the different quantum wells of the LED 100 obtained thanks to such barrier layers, the performance obtained with the LED 100 described hereinabove is compared with that of another LED comprising layers 102, 104, 106, 108 and 112 identical to that of the LED, but comprising barrier layers made with GaN and not with InGaN as in the LED 100. The n-doped layer of this other LED also comprises GaN. The various simulations described hereinbelow are carried out with the simulation software SILVACO® from ATLAS®.

Figure 2:
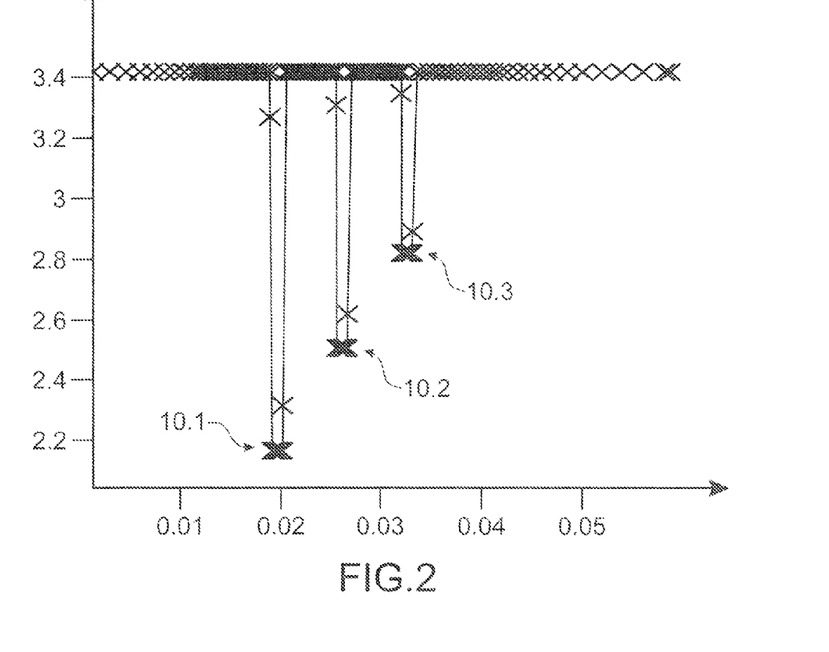
FIG. 2 shows the gaps in different layers of a light-emitting diode comprising GaN barrier layers.

FIG. 2 shows the gaps obtained within the different layers of this other LED. Three "hollows" referenced as 10.1, 10.2 and 10.3 correspondent to the gaps in the three emitting layers of this other LED.

Figure 3:
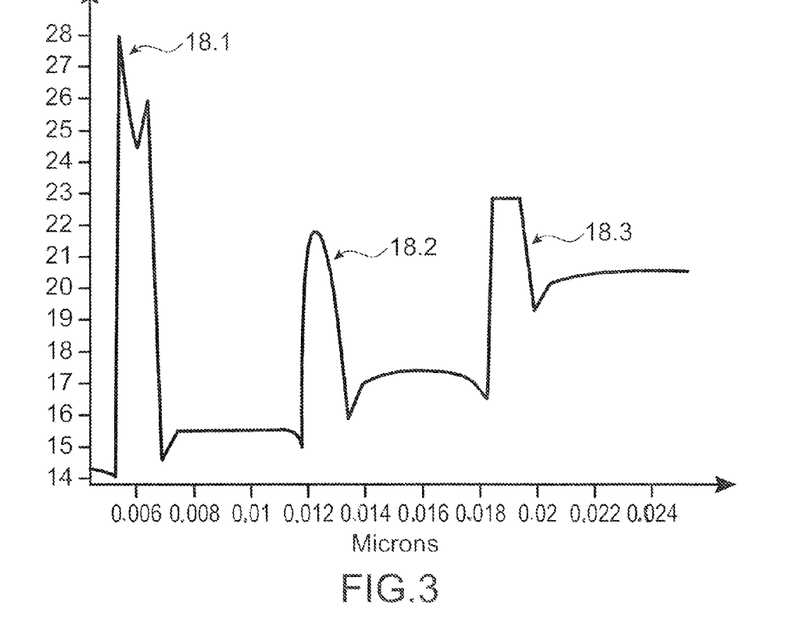
FIG. 3 shows the rate of radiative recombinations obtained in the layers of a light-emitting diode comprising GaN barrier layers.
Figure 4:
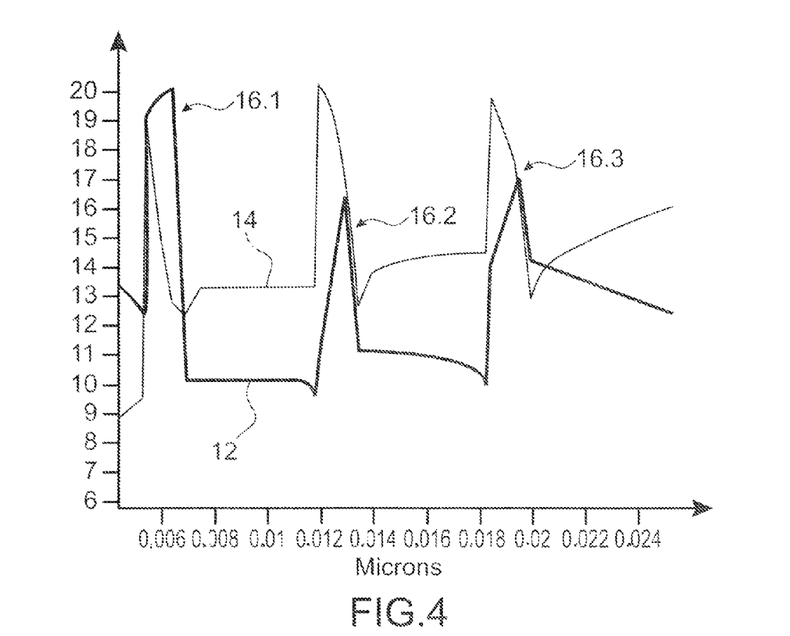
FIG. 4 shows the concentrations of electrons and of holes obtained in the layers of a light-emitting diode comprising GaN barrier layers.

FIG. 3 shows the rate of radiative recombinations, on a logarithmic scale and per cm$^3$·s, obtained in the layers of this other LED, for a current density of about 60 A/cm$^2$ obtained with a threshold voltage of about 5.2 V applied between the anode and the cathode of this other LED. This rate of radiative recombinations is according to in particular concentrations of electrons and of holes within the layers of this other LED. FIG. 4 shows the concentrations of electrons (represented by the curve 12) and of holes (represented by the curve 14), per cm$^3$, obtained in the different layers of this other LED polarised as beforehand with a voltage of about 5.2 V.

The curve 14 shown in FIG. 4 comprises three peaks of values between about 10$^{19}$ and 10$^{20}$ holes/cm$^3$, corresponding to the concentrations of holes present in the three InGaN-emitting layers of this other LED. The distribution of the holes in the emitting layers of this other LED is therefore relatively homogeneous. The curve 12 shown in FIG. 4 also shows three peaks corresponding to the concentrations of electrons in the three emitting layers of this other LED. However, the first peak of the curve 12, referenced as 16.1 and corresponding to the concentration of electrons in the first emitting layer of this other LED intended to emit in the range of wavelengths of the red colour, is much more substantial (of about 3 to 4 orders of magnitude) than the two other peaks of the curve 12, referenced as 16.2 and 16.3 and corresponding to the concentrations of electrons respectively in the second and third emitting layers intended to emit in the ranges of wavelengths of the colours green and blue. This is shown in FIG. 3 by a rate of radiative recombination that is much more substantial in the first emitting layer (peak referenced as 18.1, corresponding to the emission of red) than in the second emitting layer (peak referenced as 18.2, corresponding to the emission of green) and in the third emitting layer (peak referenced as 18.3, corresponding to the emission of blue).

It can therefore be seen that this other LED has a light emission that clearly tends to red due to the emission inhomogeneity, in terms of light intensity, of the different quantum wells of this other LED.

Figure 5:
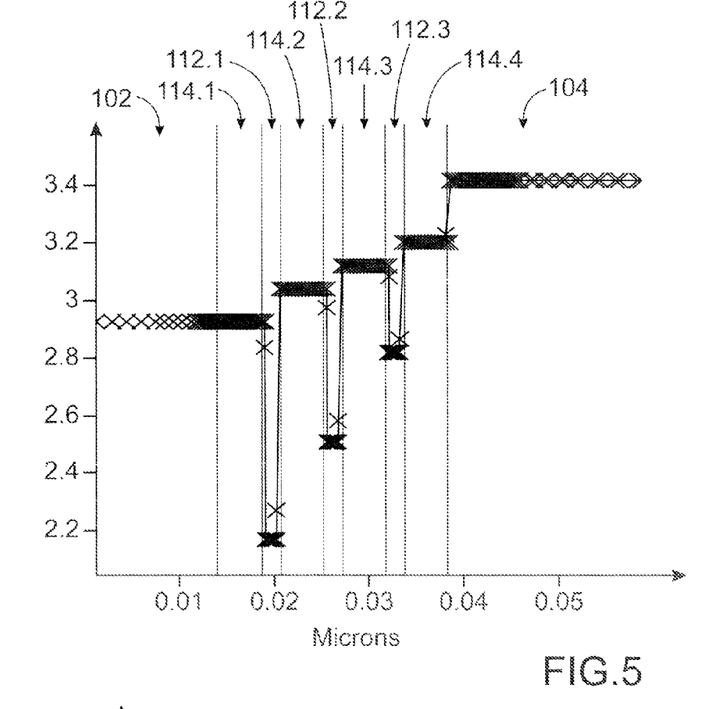
FIG. 5 shows the gaps in the layers of the light-emitting diode of the light-emitting device, subject-matter of this invention, according to the particular embodiment shown in FIG. 1.

FIG. 5 shows the gaps obtained in the different layers of the LED 100. Three "hollows" similar to those shown in FIG. 2 correspond to the gaps in the three emitting layers 112.1, 112.2 and 112.3 of the LED 100. However, in light of the different indium compositions of the materials of the barrier layers 114.1 to 114.4 of the LED 100, it can be seen in this FIG. 5 that the gaps, within the various barrier layers 114.1 to 114.4, are different for each one of the barrier layers 114.1 to 114.4.

Figure 6:
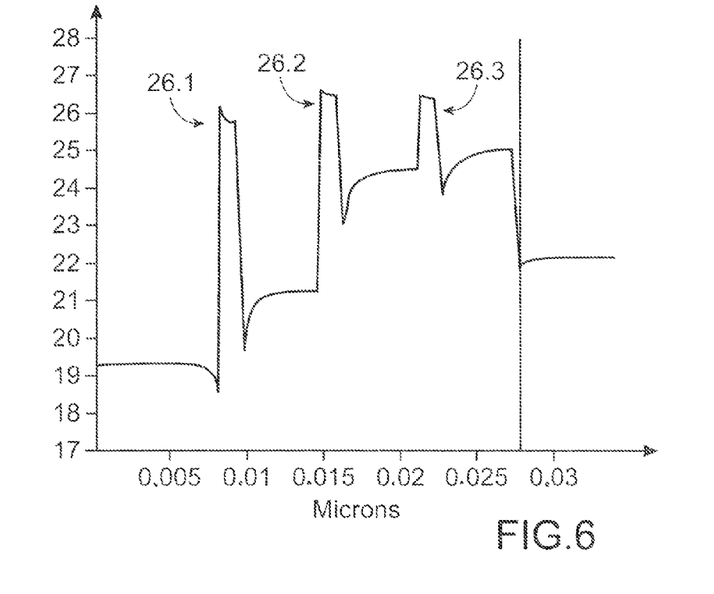
FIG. 6 shows the rate of radiative recombinations obtained in the layers of the light-emitting diode of the light-emitting device, subject-matter of this invention, according to the particular embodiment shown in FIG. 1.

FIG. 6 shows the rate of radiative recombinations, on a logarithmic scale and per $cm^3 \cdot s$, obtained in the layers of the LED 100, for a current density of about 60 A/$cm^2$ obtained with a threshold voltage of about 3.4 V applied between the anode and the cathode of the LED 100. As such, a current density of a value similar to that previously obtained in the other LED is obtained in the LED 100 with a threshold voltage less than that required in the other LED in order to obtain this current density, and this thanks to the different indium compositions in the barrier layers 114 of the LED 100.

Figure 7:
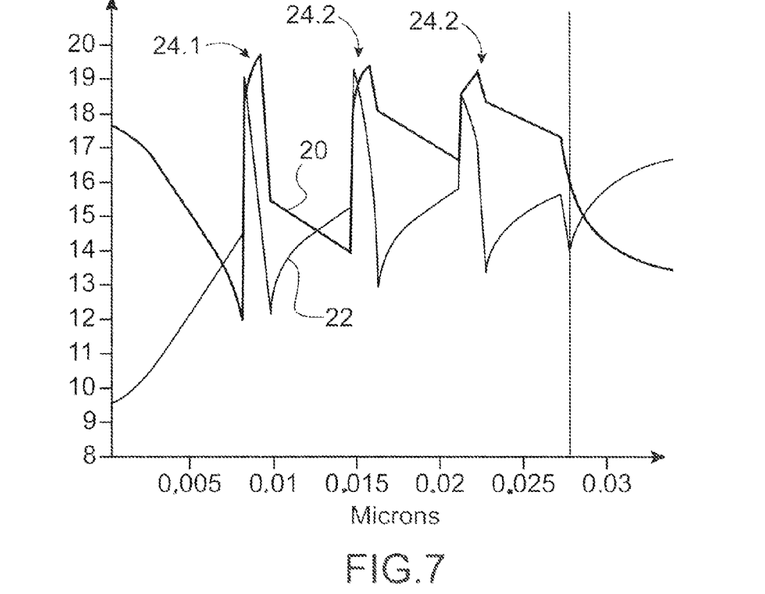
FIG. 7 shows the concentrations of electrons and of holes obtained in the layers of the light-emitting diode of the light-emitting device, subject-matter of this invention, according to the particular embodiment shown in FIG. 1.

As hereinabove, the rate of radiative recombinations is according to in particular concentrations of electrons and of holes within the layers of the LED 100. FIG. 7 shows the concentrations of electrons (represented by the curve 20) and of holes (represented by the curve 22), per $cm^3$, obtained in the various layers of the LED 100 polarised as beforehand with a voltage of about 3.4 V.

The curve 20 shown in FIG. 7 shows three peaks of values between about $10^{19}$ and $10^{20}$ holes/$cm^3$, corresponding to the concentrations of holes present in the three emitting layers 112.1 to 112.3 of the LED 100. The distribution of the holes in the emitting layers of the LED 100 is therefore relatively homogeneous. The curve 22 shown in FIG. 7 also shows three peaks corresponding to the concentrations of electrons in the three emitting layers of the LED 100. Contrary to the inhomogeneous concentrations of electrons obtained in the different emitting layers of the other LED, it can be seen that the curve 22 comprises three peaks 24.1, 24.2 and 24.3 of close values (approximately equal to about $10^{19}$ electrons/$cm^3$) being superposed globally on the three peaks of the curve 20, with these three peaks 24.1, 24.2 and 24.3 corresponding to the concentrations of electrons in the three emitting layers 112.1 to 112.3 of the LED 100. This results in FIG. 6 by rates of radiative recombinations of close values (between about $10^{26}$ and $10^{27}$ $cm^{-3} \cdot s^{-1}$) in the three emitting layers (corresponding to the peaks referenced as 26.1, 26.2 and 26.3), which means that the light emissions in red, green and blue carried out by the quantum wells of the LED 100 are homogeneous, i.e. of substantially similar intensities. As such, thanks to the barrier layers 114 of the LED 100 comprising wisely chosen indium compositions, the light emission carried out by the different quantum wells of the LED 100 is homogeneous, which allows the LED 100 to carry out an emission of white light.

In the embodiment described hereinabove, the layer 102 comprises GaN-n or InGaN-n, i.e. a constant indium composition (zero or not) along the thickness of the n-doped layer 102.

Alternatively, the indium composition of the n-doped layer 102 may vary, for example linearly, in the direction of the thickness of the n-doped layer 102, as such forming a gradient in the indium composition of the material of the n-doped layer 102 along the thickness of the n-doped layer 102. Considering the indium composition Xn of the n-doped layer 102, the value of Xn may vary between a first value $Xn_a$, corresponding to the value of the indium composition of the n-doped layer 102 at its second face 111, and a second value $Xn_b$, corresponding to the value of the indium composition of the n-doped layer 102 at its first face 109, such that the second value $Xn_b$ is greater than the first value $Xn_a$. The first value $Xn_a$ is for example zero, the n-doped layer 102 comprising in this case GaN on its second face 111, and the second value $Xn_b$ is for example equal to the indium composition of the first barrier layer 114.1. Such an n-doped layer 102 makes it possible to progressively pass from GaN that does not comprise indium to the InGaN of which the indium composition corresponds to that of the material of the first barrier layer 114.1. According to an advantageous alternative, the gradient of the indium composition within the n-doped layer 102 may be such that the second value $Xn_b$ is less than the first value $Xn_a$, with for example in this case $Xn_b < Xn_a < 2 \cdot Xn_b$. According to another alternative, it is possible to have a buffer layer arranged between the n-doped layer 102 and the first barrier layer 114.1 and that would comprise InGaN with such a gradient of its composition of indium. In the embodiment described hereinabove, each one of the barrier layers 114 comprises a constant indium composition along the thickness of each one of these barrier layers. Alternatively, one or several of these barrier layers 114 may comprise an indium composition varying, for example linearly, in the direction of the thickness of this or of these barrier layers 114, as such forming a gradient in the indium composition of the material of this or of each one of these barrier layers 114 along the thickness of this or of these barrier layers 114. Considering the indium composition Zj in each one of the barrier layers 114, with j integer between 1 and m+1, the value of Zj may vary between a first value $Zj_a$ and a second value $Zj_b$ greater than the first value $Zj_a$ according to a direction substantially perpendicular to a face of said barrier layer 114 against which one of the emitting layers 106 is arranged, the indium composition at a first face of said barrier layer 114 located on the side with the n-doped layer 102 being equal to $Zj_b$, the indium composition at a second face of said barrier layer 114, opposite said first face and located on the side the p-doped layer 104 being equal to $Zj_a$. For such barrier layers 114, the difference between the first value $Zj_a$ and the second value $Zj_b$ is more preferably less than or equal to about 0.3.

In the embodiments described hereinabove, the choice of the wavelengths emitted by the emitting layers of the LED 100 is carried out via the choice of the indium compositions within the emitting layers. In a complementary manner, it is possible to adjust the global light spectrum emitted by the LED 100, i.e. the spectrum of the emitted light at the output of the LED 100, by emitting the various emitting layers of the LED 100 with more or less intensity via the choice of the parameters of the periodic signal electrically powering the LED 100.

Indeed, by varying the current density passing through the LED 100, it is possible to vary the rates of radiative recombinations within the various emitting layers of the LED 100.

Figure 8A:
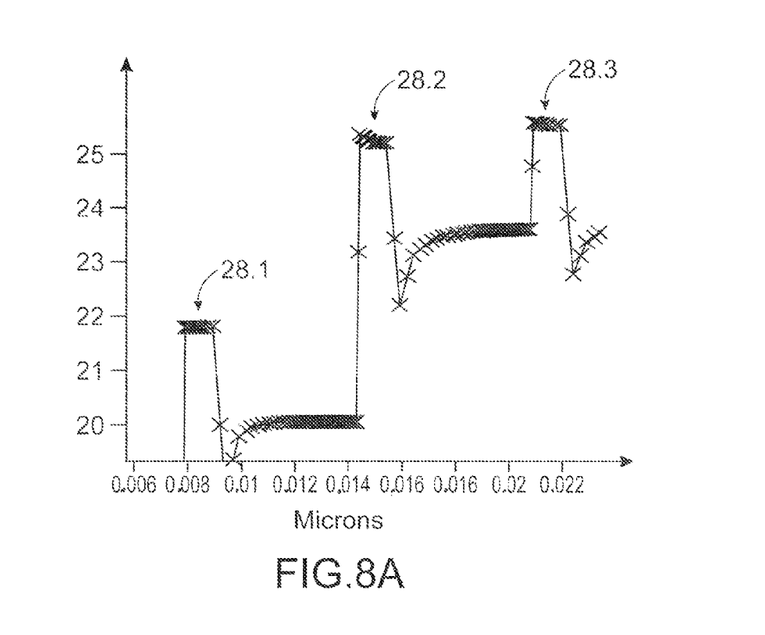
FIGS. 8A to 8D show the rate of radiative recombinations obtained in the layers of the light-emitting diode of the light-emitting device, subject-matter of this invention and according to the particular embodiment shown in FIG. 1, for different values of the current density in the light-emitting diode.

FIG. 8A shows the rate of radiative recombinations, on a logarithmic scale and per cm³·s, obtained in the layers of the LED 100, for a current density of about 10 A/cm² in the LED 100. It can be seen in this figure that the rate of radiative recombinations obtained in the third emitting layer 112.3 (corresponding to the peak 28.3), which emits a blue light, is higher than that obtained in the second emitting layer 112.2 (corresponding to the peak 28.2), which emits a green light, and also much higher than that obtained in the first emitting layer 112.1 (corresponding to the peak 28.1) which emits a red light. As such, with such a current density of about 10 A/cm² passing through the LED 100, the spectrum of the light obtained at the output of the LED 100 will tend to that of a blue light.

Figure 8B:
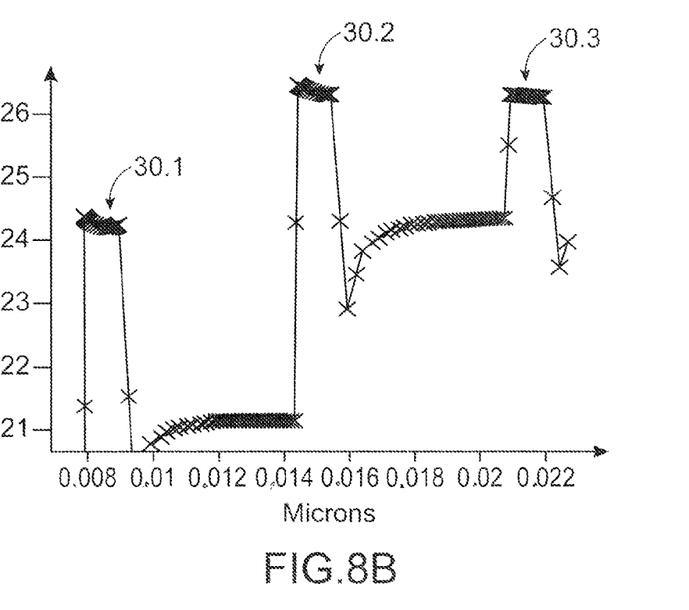

FIG. 8B shows the rate of radiative recombinations, on a logarithmic scale and per cm³·s, obtained in the layers of the LED 100, for a current density of about 50 A/cm² in the LED 100. It can be seen in this figure that the rate of radiative recombinations obtained in the second emitting layer 112.2 (corresponding to the peak 30.2) is here greater than that obtained in the third emitting layer 112.3 (corresponding to the peak 30.3), and also much greater than that obtained in the first emitting layer 112.1 (corresponding to the peak 28.1). As such, with such a current density of about 50 A/cm² passing through the LED 100, the spectrum of the light obtained at the output of the LED 100 will tend to that of a green light.

Figure 8C:
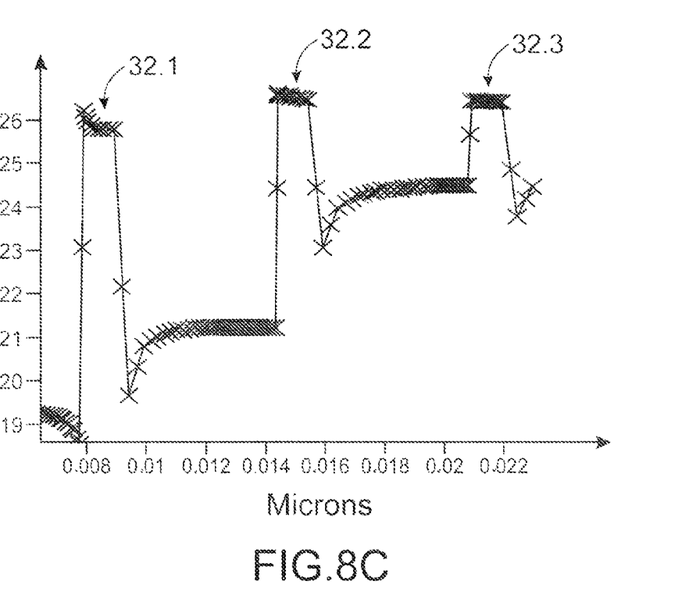

FIG. 8C shows the rate of radiative recombinations, on a logarithmic scale and per cm³·s, obtained in the layers of the LED 100, for a current density of about 80 A/cm² in the LED 100. It can be seen in this figure that the rate of radiative recombinations obtained in the first emitting layer 112.1 (corresponding to the peak 32.1) is substantially similar to that obtained in the second emitting layer 112.2 (corresponding to the peak 32.2), and also substantially similar to that obtained in the third emitting layer 112.3 (corresponding to the peak 32.3). As such, with such a current density of about 80 A/cm² passing through the LED 100, the spectrum of the light obtained at the output of the LED 100 will tend to that of a white light due to the fact that the light emissions carried out by the three emitting layers 112.1, 112.2 and 112.3 are substantially equivalent in terms of emission intensity.

Figure 8D:
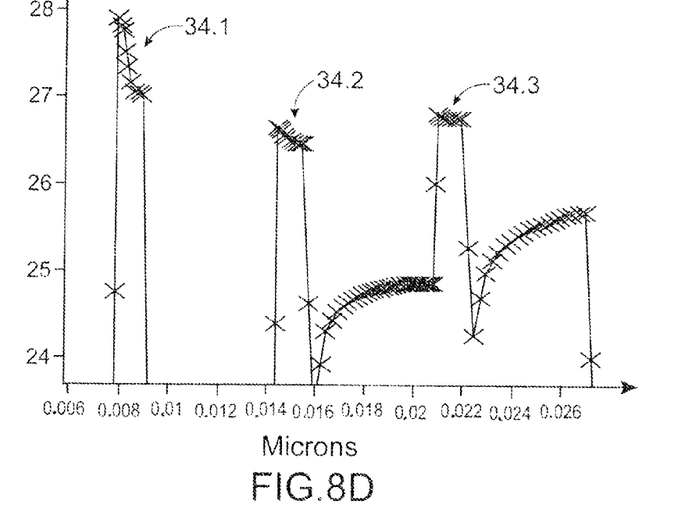

FIG. 8D shows the rate of radiative recombinations, on a logarithmic scale and per cm³·s, obtained in the layers of the LED 100, for a current density of about 140 A/cm² in the LED 100. It can be seen in this figure that the rate of radiative recombinations obtained in the first emitting layer 112.1 (corresponding to the peak 34.1) is greater than that obtained in the second emitting layer 112.2 (corresponding to the peak 34.2), and also greater than that obtained in the third emitting layer 112.3 (corresponding to the peak 34.3). As such, with such a current density of about 140 A/cm² passing through the LED 100, the spectrum of the light obtained at the output of the LED 100 will tend to that of a red light.

Figure 9:
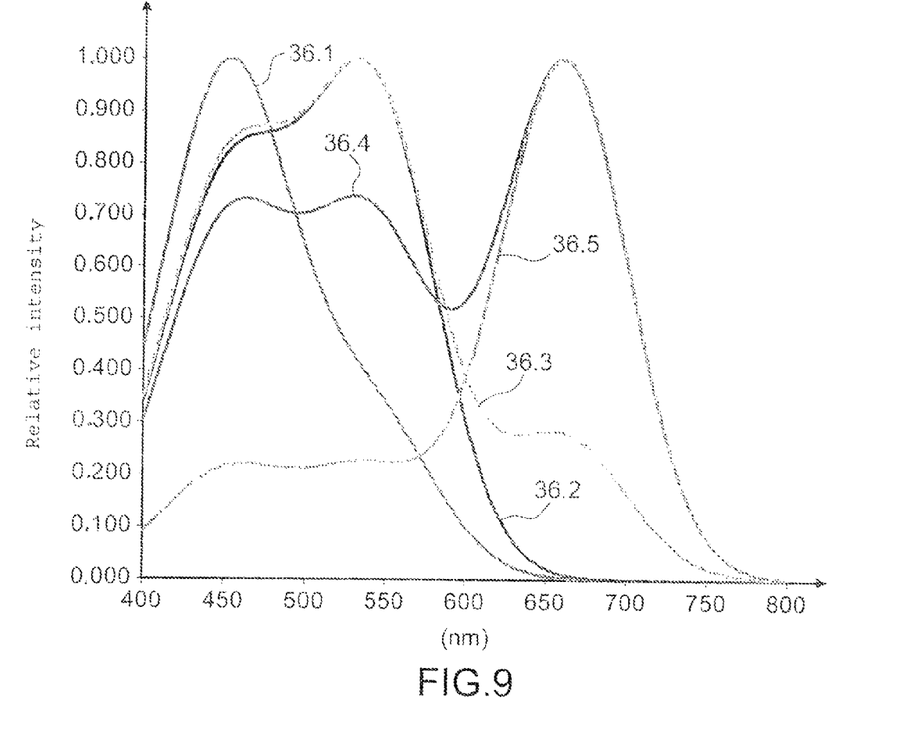
FIG. 9 shows the relative intensity of the light emitted by the light-emitting diode of the light-emitting device, subject-matter of this invention and according to the particular embodiment shown in FIG. 1, for different values of the current density in the light-emitting diode, according to the wavelength.

FIG. 9 shows the relative intensity (on a scale from 0 to 1) obtained for different values of the current density of the electric power signal of the LED 100, according to the wavelength (in nm). The curve 36.1 corresponds to a current density equal to about 10 A/cm², the curve 36.2 corresponds to a current density equal to about 50 A/cm², the curve 36.3 corresponds to a current density equal to about 60 A/cm², the curve 36.4 corresponds to a current density equal to about 90 A/cm², and the curve 36.5 corresponds to a current density equal to about 140 A/cm².

Figure 10:
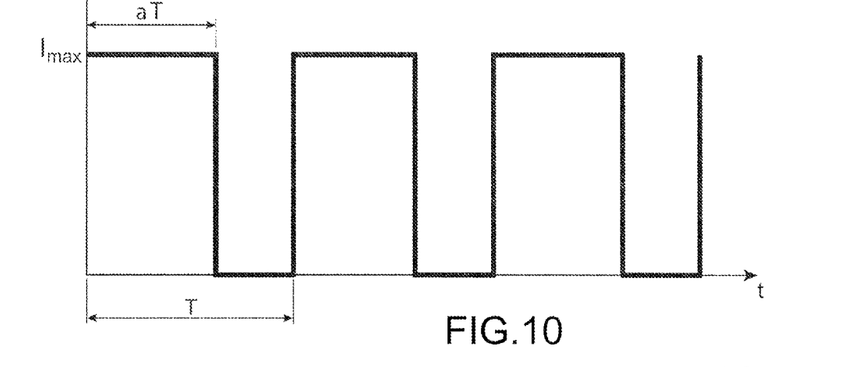
FIG. 10 diagrammatically shows an electrical power signal of the light-emitting diode of the light-emitting device, subject-matter of this invention.

Due to the fact that the LED 100 is powered with a periodic signal (current or voltage) that corresponds for example to a square signal such as the one shown in FIG. 10 which corresponds to a current comprising a peak value $I_{max}$, a period T and a duty cycle α, it is possible to vary the value of the current density passing through the LED 100, and therefore the colour of the light emitted at the output of the LED 100, by varying the peak value $I_{max}$ of the power signal of the LED 100. Varying the current density passing through the LED 100 will also vary the intensity of the light emitted by the LED 100. If it is desired that the change in the colour of the light emitted by the LED 100 carried out by varying the current density passing through the LED 100 does not impact the light emission intensity of the LED 100, it is possible to also vary the value of the duty cycle α of the electric power signal of the LED 100. Indeed, by varying the value of this duty cycle α, the duration is also varied during which the LED 100 will emit light over each period of the electric power signal, and will therefore vary the intensity of the light emitted by the LED 100.

As such, in the examples described hereinabove, an emission of a light of blue colour (case of FIG. 8A) is for example obtained by choosing a duty cycle α=1 and by choosing a peak value $I_{max}$ such that the current density in the LED 100 is equal to about 10 A/cm². If it is desired carry out an emission of a light of green colour (case of FIG. 8B) with a light intensity substantially equal to that obtained during the preceding light emission of blue colour, the peak value $I_{max}$ is modified so that the LED 100 is passed through by a current density substantially equal to about 50 A/cm², and the duty cycle α is chosen equal to about 0.2 (10/50=0.2). If it is desired to carry out an emission of a light of white colour (case of FIG. 8C) with a light intensity substantially equal to that obtained during the preceding light emission of blue colour, the peak value $I_{max}$ is modified so that the LED 100 is passed through by a current density substantially equal to about 80 A/cm², and the duty cycle α is chosen equal to about 0.125 (10/80=0.125). Finally, if it is desired to carry out an emission of a light of red colour (case of FIG. 8D) with a light intensity substantially equal to that obtained during the preceding light emission of blue colour, the peak value $I_{max}$ is modified so that the LED 100 is passed through by a power current of which the current density is substantially equal to about 140 A/cm², and the duty cycle α is chosen equal to about 0.07 (10/140=0.07).

The LED 100 may be made in the form of a planar diode as shown in FIG. 1, i.e. in the form of a stack of layers formed on a substrate (the substrate not being shown in FIG. 1), with the main faces of the various layers being arranged parallel to the plane of the substrate (parallel to the plane (X,Y)). The layers of GaN and of InGaN of such a planar diode may be made on a sapphire substrate, for example by MOCVD (Metal Organic Chemical Vapour Deposition). The metal electrodes 106 and 108 may then be made by metal deposits on each side of this stack of layers.

Figure 11A:
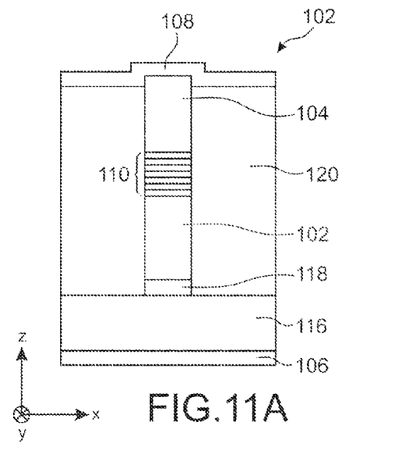
FIGS. 11A and 11B diagrammatically show light-emitting diodes of light-emitting devices, subject-matter of this invention, made in the form of nanowires.

Alternatively, the LED 100 may be made in the form of a nanowire. FIG. 11A shows such a LED 100 made in the form of an axial nanowire, with this nanowire comprising a stack formed of the first metal electrode 106, of a substrate 116 of n-type semiconductor (for example gallium), of a nucleation layer 118 allowing for the growth of the nanowire, of the layer 102 of InGaN-n, of the active zone 110, of the layer 104 of GaN-p or of InGaN-p, and of the second electrode 108. An insulating material 120 can surround at least a portion of this nanowire which extends parallel to the Z-axis.

Figure 11B:
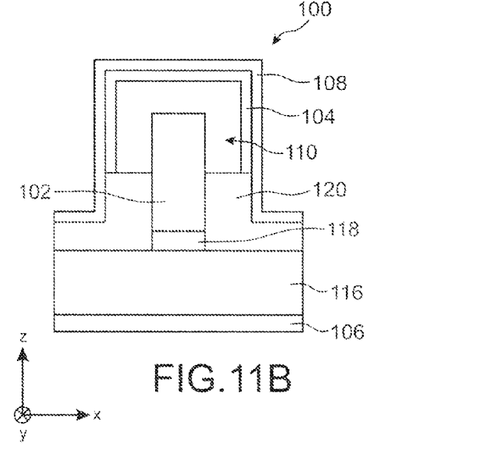

FIG. 11B shows a LED 100 made in the form of a radial nanowire, with this nanowire comprises a stack formed of the first electrode 106, of the substrate 116, of the nucleation layer 118 and of the n-doped layer 102. Insulating portions 120 partially surround the n-doped layer 102 and the nucleation layer 118. The active zone 110 (formed of the barrier layers 114 and of the emitting layers 112) is made such that it surrounds at least a portion of the layer 102. The p-doped layer 104 is made such that it surrounds the active zone 110. Finally, the second electrode 108 is made by covering the p-doped layer 104.

As an alternative to the two embodiments described in the FIGS. 11A and 11B, the structure of these nanowires may be inverted, with in this case a substrate 124 of p-doped semiconductor, for example gallium, whereon is made the p-doped layer 104, then the other elements of the LED 100 in the opposite order of that described in the FIGS. 11A and 11B.

Such nanowire structures can be obtained by MOCVD growth.

The various characteristics (thicknesses, doping, etc.) disclosed hereinabove for the LED 100 of the planar type can be similar for the LED 100 made in the form of nanowires.

Figure 12:
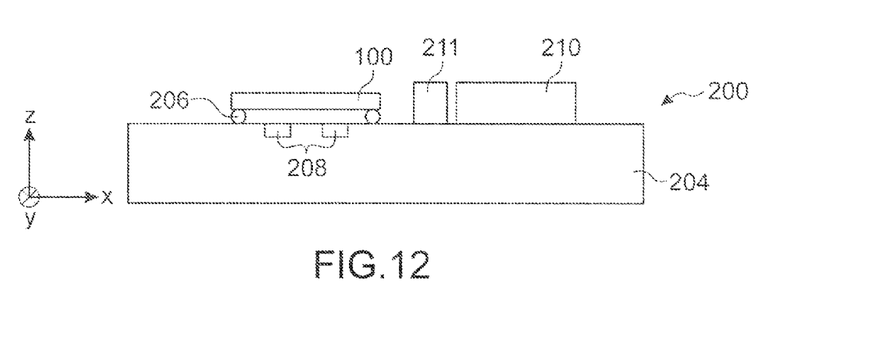
FIG. 12 diagrammatically shows a light-emitting device, subject-matter of this invention, according to a particular embodiment.

FIG. 12 diagrammatically shows a light-emitting device 200 according to a particular embodiment.

The light-emitting device 200 comprises a LED 100 such as described hereinabove. The LED 100 is mechanically and electrically coupled on a substrate 204, for example comprising silicon, via beads of fusible material 206. Alternatively, the LED 100 could be made directly by growth on the substrate 204. The LED 100 is here able to emit both from a rear face located facing the substrate 204 and from a front face opposite the rear face.

The light-emitting device 200 comprises a device for detecting the value of a spectrum and of an intensity of the light emitted by the LED 100 comprising here two photodiodes 208 made in the substrate 204, and which are arranged facing the rear face of the LED 100. A first of the two photodiodes 208 detects the wavelengths less than a first cutoff wavelength named $\lambda_1$ and for example equal to about 450 nm. A second of the two photodiodes 208 detects the wavelengths greater than a second cutoff wavelength named $\lambda_2$ which is such that $\lambda_2 > \lambda_1$ and for example equal to about 470 nm. The first cutoff wavelength $\lambda_1$ is for example defined by a low-pass filter made in front of the first of the two photodiodes 208 (between this first photodiode and the LED 100) and the second cutoff wavelength $\lambda_2$ is for example defined by a high-pass filter made in front of the second of the two photodiodes 208 (between this second photodiode and the LED 100).

The device for detecting the value of the spectrum and of the intensity of the light emitted by the LED 100 also comprises calculating means (not shown in FIG. 12) coupled to the photodiodes 208 and making it possible to calculate, using the sum of the electrical signals, or photo-currents, outputted by the photodiodes 208 the intensity of the light, or total light power, emitted by the LED 100. These means for calculating also make it possible to calculate the spectrum of the light emitted by the LED 100 using the relationship between the electrical signals outputted by the two photodiodes 208.

Alternatively, the detecting of the value of the spectrum and the detecting of the intensity of the light emitted by the LED 100 could be carried out by two separate devices.

The light-emitting device 200 also comprises an electric power supply 210, for example switched-mode type, making it possible to electrically power the LED 100. This alimentation 210 outputs a voltage or a current in the form of a periodic signal, for example a square signal such as the one shown in FIG. 10, with a period T and for which a peak value Imax or Umax and a duty cycle $\alpha$ can be adjusted, the duty cycle $\alpha$ being such that $\alpha \epsilon ]0;1]$.

These parameters of the electrical signal outputted by the power supply 210 are controlled by a control device 211 receiving as input the detected values of the spectrum and of the intensity of the light emitted by the LED 100 and outputting a control signal sent to the power supply 210 (alternatively, it is possible that the control device 211 and the electric power supply 210 form a single element). These elements form a feedback loop such that the peak value Imax or Umax and the duty cycle $\alpha$ of the signal outputted by the power supply 210 are according to the spectrum and the intensity desired for the light intended to be emitted by the LED 100. As such, in order to adjust the intensity and the spectrum of the light emitted by the LED 100, the peak value and the duty cycle of the power signal are adjusted so that the sum and the relationship of the photo-currents outputted by the photodiodes 208 have values equal to those obtained for a desired intensity and spectrum (these target values of the sum and of the relationship of the photo-currents are known or are determined beforehand with a LED serving as a reference). When the detecting of the spectrum and the detecting of the light intensity are carried out by two separate devices, these two devices may be coupled optically to the LED 100 and electrically connected to the control device 211 by forming two feedback loops.

The device for detecting the light-emitting device 200 can be made in an integral manner with the substrate as described for example in document US 2009/0040755 A1.

Thanks to the device for detecting the value of the spectrum of the light emitted by the LED 100 which is formed by the two photodiodes 208 of the light-emitting device 200 described hereinabove, with this device for detecting being connected to the control device 211 which itself is connected to the power supply 210 by forming a feedback loop, the spectrum of the light emitted by the LED 100 is therefore adjusted via the adjusting of the peak value of the electric power signal of the LED 100, for example here the adjusting of the value Imax of the current outputted by the power supply 210 (with the current density passing through the LED 100 being according to this value Imax), which is carried out according to the desired emission spectrum. As such, if the photodiodes 208 detect that the LED 100 is emitting a wavelength with a value that is too high, the control device 211 receiving as input the signals outputted by the photodiodes 208 then orders the switched-mode electric power supply 210 to output a current with a stronger amplitude. Inversely, if the photodiodes 208 detect that the LED 100 is emitting a light with a wavelength that is too low, the control device 211 then orders the electric power supply 210 to output a current with a lower amplitude.

The modification of the peak value of the electric power signal of the LED 100, and therefore of the current density passing through the LED 100, affects the wavelength emitted by the LED 100 but also the intensity of the light emitted by the LED 100. In order to prevent the light intensity emitted by the LED 100 from being affected by the modification in the current density passing through the LED 100 carried out to adjust the emitted wavelength, this light emission intensity of the LED 100 is adjusted to the desired level via the adjustment of the duty cycle α of the periodic electric power signal of the LED 100.

Indeed, by powering the LED 100 with a voltage or a current in the form of a periodic square signal comprising a duty cycle α (which is equal to the relationship of the duration during which, during a period T, the current is equal to the peak value, over the total duration of the period T), the intensity of the light emitted by the LED 100 will depend on the peak value but also on the value of α.

The period T of the periodic electric power signal of the LED 100 is chosen sufficiently small so as not to observe any flickering or blinking of the LED 100, and that corresponds for example to a frequency between about 20 Hz and 1 MHz.

As such, if the device for detecting the intensity of the light emitted by the LED 100 detects an intensity that is too strong, the control device 211 receiving as input the signal outputted by this detecting device then orders the electric power supply 210 to output current with a smaller duty cycle α. Inversely, if the device for detecting the intensity of the light emitted by the LED 100 detects that the LED 100 is emitting a light with an intensity that is too low, the control device 211 then orders the electric power supply 210 to output current with a larger duty cycle α.

The invention claimed is:

1. A light-emitting device comprising:
   a light-emitting diode comprising at least one n-doped $In_{Xn}Ga_{(1-Xn)}N$ layer and a p-doped GaN layer forming together a p-n junction, and an active zone arranged between the n-doped $In_{Xn}Ga_{(1-Xn)}N$ layer and the p-doped GaN layer and comprising a number m of $In_{Yi}Ga_{(1-Yi)}N$-emitting layers each one arranged between two $In_{Zj}Ga_{(1-Zj)}N$ barrier layers that are in contact with the emitting layer on the two opposite faces of the emitting layer, wherein:
   for i between 1 and m−1, the indium compositions of the emitting layers are such that Y(i+1)<Yi, the $(i+1)^{th}$ emitting layer being arranged between the $(i)^{th}$ emitting layer and the p-doped GaN layer;
   for j between 1 and m, the indium compositions of the barrier layers are such that Z(j+1)<Zj, the $(j+1)^{th}$ barrier layer being, arranged between the $(j)^{th}$ barrier layer and the p-doped GaN layer;
   for i=j, the indium compositions of the emitting layers and of the barrier layers are such that Zj<Yi and Z(j+1)<Yi;
   with m: integer greater than or equal to 2;
   i: integer between 1 and m;
   j: integer between 1 and (m+1);
   an electric power supply configured to electrically power the light-emitting diode with a periodic signal;
   a controller of the electric power supply which can alter the peak value of the periodic signal according to at least one spectrum of the light to be emitted by the light-emitting diode; and
   wherein the indium compositions Yi, or Zj, or both Yi and Zj, are such that Z(m+1)=0 and at least one of the following conditions is fulfilled:

for i=j: $0.15Yi<Zj<0.9Yi$, and for j between 1 and m: $0.25Zj<Z(j+1)<0.9Zj$.

2. The light-emitting device according to claim 1, wherein the barrier layers each have a thickness between about 1 nm and 25 nm, and/or the first $In_{Z1}Ga_{(1-Z1)}N$ barrier layer has a thickness greater than or equal to 2 nm.

3. The light-emitting device according to claim 1, wherein the number in of emitting layers is equal to 3, with the first emitting layer able to carry out a light emission in a range of wavelengths of colour red, with the second emitting layer able to carry out a light emission in a range of wavelengths of colour green, and the third emitting layer able to carry out a light emission in a range of wavelengths of colour blue.

4. The light-emitting device according to claim 1, wherein the number m of emitting layers is equal to 3, and wherein at least one of the following conditions is fulfilled: Y1 is equal to about 0.4, Y2 is equal to about 0.25, Y3 is equal to about 0.15, Z1 is equal to about 0.12, Z2 is equal to about 0.09, Z3 is equal to about 0.07, and Z4 is equal to about 0.05.

5. The light-emitting device according to claim 1, wherein the indium composition Xn is between 0 and about 0.3, and/or wherein the indium composition Xn varies between a first value $Xn_a$ and a second value $Xn_b$ greater than the first value $Xn_a$ according to a direction substantially perpendicular to a first face of the n-doped $In_{Xn}Ga_{(1-Xn)}N$ layer opposite which the first emitting layer is arranged, and wherein the indium composition at the first face of the n-doped $In_{Xn}Ga_{(1-Xn)}N$ layer is equal to $Xn_b$ and the indium composition at a second face of the n-doped $In_{Xn}Ga_{(1-Xn)}N$ layer, opposite the first face, is equal to $Xn_a$.

6. The light-emitting device according to claim 5, wherein $Xn_a$ is equal to 0, and wherein $Xn_b$ is greater than 0 and less than or equal to about 0.3.

7. The light-emitting device according to claim 1, wherein the indium composition Zj in each one of the barrier layers varies between a first value $Zj_a$ and a second value $Zj_b$ greater than the first value $Zj_a$ according to a direction substantially perpendicular to a face of the barrier layer against which one of the emitting layers is arranged, the indium composition at a first face of the barrier layer located on the side of the n-doped $In_{Xn}Ga_{(1-Xn)}N$ layer being equal to $Zj_b$, the indium composition at a second face of the barrier layer, opposite the first face and located on the side of the p-doped GaN layer being equal to $Zj_a$.

8. The light-emitting device according to claim 7, wherein the indium compositions Zj in each one of the barrier layers are such that $Zj_a<Z(j+1)_b$ and/or, for each one of the barrier layers, the difference between the first value $Zj_a$ and the second value $Zj_b$ is less than or equal to about 0.3.

9. The light-emitting device according to claim 1, wherein the periodic signal comprises a duty cycle α, and wherein the controller is configured to modify the duty cycle α of the periodic signal according to a value of intensity of light to be emitted by the light-emitting diode.

10. The light-emitting device according to claim 9, further comprising:
    a detector of a spectrum and/or of an intensity of a light to be emitted by the light emitting diode; and
    wherein the controller is configured to modify the peak value and/or the duty cycle α of the periodic signal respectively according to the values of the spectrum and of the intensity of the light to be detected and according to target values of the spectrum and of the intensity.

11. The light-emitting device according to claim 1, wherein the periodic signal is a square signal.

12. The light-emitting device according to claim 1, wherein one or more of the barrier layers have different heights.

13. The light-emitting device according to claim 1, wherein barrier heights of the $In_{Zj}Ga_{(1-Zj)}N$ barrier layers are set according to said conditions to progressively change adjacent barrier heights of the $In_{Zj}Ga_{(1-Zj)}N$ barrier layers.

14. The light-emitting device according to claim 1, wherein band gaps of the $In_{Yi}Ga_{(1-Yi)}N$ emitting layers are set according to said conditions to progressively change adjacent band gaps of the $In_{Yi}Ga_{(1-Yi)}N$ emitting layers.

15. The light-emitting device according to claim 1, wherein barrier heights of the $In_{Zj}Ga_{(1-Zj)}N$ barrier layers and band gaps of the $In_{Yi}Ga_{(1-Yi)}N$ emitting layers are set according to said conditions to progressively change adjacent barrier heights of the $In_{Zj}Ga_{(1-Zj)}N$ barrier layers and adjacent band gaps of the $In_{Yi}Ga_{(1-Yi)}N$ emitting layers.

16. A method for making a light-emitting device comprising:
   forming a light-emitting diode comprising at least one n-doped $In_{Xn}Ga_{(1-Xn)}N$ layer and a p-doped GaN layer forming together a p-n junction, and an active zone arranged between the n-doped $In_{Xn}Ga_{(1-Xn)}N$ layer and the p-doped GaN layer and comprising a number m of $In_{Yi}Ga_{(1-Yi)}N$-emitting layers each one arranged between two $In_{Zj}Ga_{(1-Zj)}N$ barrier layers that are in contact with the emitting layer on the two opposite faces of the emitting layer, wherein:
      for i between 1 and m−1, the indium compositions of the emitting layers are such that $Y(i+1)<Yi$, the $(i+1)^{th}$ emitting layer being arranged between the $(i)^{th}$ emitting layer and the p-doped GaN layer;
      for j between 1 and m, the indium compositions of the barrier layers are such that $Z(j+1)<Zj$, the $(j+1)^{th}$ barrier layer being arranged between the $(j)^{th}$ barrier layer and the p-doped GaN layer;
      for i=j, the indium compositions of the emitting layers and of the barrier layers are such that $Zj<Yi$ and $Z(j+1)<Yi$;
   with m: integer greater than or equal to 2;
   i: integer between 1 and m;
   j: integer between 1 and (m+1);
   wherein the indium compositions Yi, or Zj, or both Yi and Zj, are such that $Z(m+1)=0$ and at least one of the following conditions is fulfilled:

for $i=j$: $0.15\ Yi<Zj<0.9\ Yi$, and for $j$ between 1 and $m$: $0.25\ Zj<Z(j+1)<0.9\ Zj$, and wherein the layers of the light-emitting diode are planar layers made by growth on top of one another, or wherein the layers of the light-emitting diode are made by growth in a form of radial or axial nanowires.

\* \* \* \* \*